United States Patent
Tseng et al.

(10) Patent No.: US 7,071,007 B2
(45) Date of Patent: Jul. 4, 2006

(54) METHOD OF FORMING A LOW VOLTAGE DRIVE FERROELECTRIC CAPACITOR

(75) Inventors: Yuan-Chieh Tseng, Kaohsiung (TW); Chao-Hsiung Wang, Hsinchu (TW); Tai-Bor Wu, Hsinchu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 192 days.

(21) Appl. No.: 10/313,776

(22) Filed: Dec. 6, 2002

(65) Prior Publication Data

US 2004/0110309 A1 Jun. 10, 2004

(51) Int. Cl.
*H01L 21/00* (2006.01)

(52) U.S. Cl. .......................... 438/3; 438/253; 438/396; 438/381

(58) Field of Classification Search ............... 438/3, 438/240–244, 253, 381, 396, 11; 257/295, 257/306, 310
See application file for complete search history.

(56) References Cited

U.S. PATENT DOCUMENTS

| | | | |
|---|---|---|---|
| 6,180,970 B1 | 1/2001 | Hwang et al. | |
| 6,238,933 B1 | 5/2001 | Sun et al. | |
| 6,274,388 B1 | 8/2001 | Aggarwal et al. | |
| 2001/0000624 A1 | 5/2001 | Hwang et al. | |
| 2002/0074601 A1 | 6/2002 | Fox et al. | |
| 2004/0070015 A1* | 4/2004 | Lung et al. | 257/290 |

OTHER PUBLICATIONS

Hwang et al., "Microstructure and mechanical properties of lead zirconate titanate (PZT) nanocomposites withplantinum particles", Journal of the Cer. Soc. of Japan , 2000, 108 Apr., pp. 339-344.*

Meng et al. ,"Enhanced fatigue propery of PZT thin films using LaNiO3 thin layer as bottom electrode", Appl. Phy. A. 2001, 73 (3), pp. 323-325.*

Hwang et al. ,"Characterizations of sputtered PZT thin films on Pt/Ti?Si substratges", Han'guk Chaelyo Hakhoechi , 1994, 4(2), pp. 143-151.*

Li et al., Electrical and Mechanical Properties of Piezoelectric Ceramic/Metal Composites in the Pb(Zr,Ti)O3/Pt system., Appl. Phys.Letters , vol. 79(15), pp. 2441-2443, (2001).*

(Continued)

*Primary Examiner*—Michael Lebentritt
*Assistant Examiner*—Yennhu B. Huynh
(74) *Attorney, Agent, or Firm*—Duane Morris LLP

(57) ABSTRACT

A method of forming a low-voltage drive thin film ferroelectric capacitor includes the steps of depositing a ferroelectric and platinum thin film dielectric layer over a bottom electrode, annealing the dielectric layer, wherein a nanocomposite layer is formed including nanoparticles of platinum and forming a top electrode over the dielectric layer. An integrated circuit is also provided including a ferroelectric capacitor. The capacitor includes a bottom electrode formed over a substrate and a ferroelectric and platinum thin film nanocomposite dielectric layer formed over the bottom electrode, wherein the nanocomposite layer includes nanoparticles of platinum. A top electrode is formed over the dielectric layer.

41 Claims, 7 Drawing Sheets

OTHER PUBLICATIONS

Yun Wu and Guozhong Cao, "Enhanced Ferroelectric Properties and Lowered Processing Temperatures of Strontium Bismuth Niobates with Vanadium Doping" Applied Physics Letters, vol. 75, No. 17, Oct. 25, 1999, pp. 5354-5357.

Tomio Hirano, et al., "Effects of Excess Lead Addition on Processing of Sol-Gel Derived Lanthanum-Modified Lead Zirocnate Titanate Thin Film" Jpn. J. Appl. Phys. vol. 38 (1999) pp. 5354-5357.

B. Yang, T.K. Song, S. Aggarwal, and R. Ramesh, "Low Voltage Performance of Pb(Zr,Ti)O$_3$ Capacitors Through Donor Doping" Appl. Phys. Lett., vol. 71 (24), Dec. 15, 1997, pp. 3578-3580.

T.K. Kundu and D. Chakravorty, "Nanocomposites of Lead-Zirconate-Titanate Glass Ceramics and Metallic Silver," Appl. Phys. Lett. 67(18), Oct. 30, 1995, pp. 2732-2734.

T.K. Kundu and D. Chakravorty, "Nanocomposites Films of Lead Zirconate Titanate and Metallic Nickel by Sol-Gel Route," Appl. Phys. Lett. 68 (26) Jun. 26, 1995, pp. 3576-3578.

N. Duan et al., "Enhancement of Dielectric and Ferroelectric Properties by Addition of PT Particles to a Lead Zirconate and Titanate Matrix," Applied Physics Letters, vol. 77, No. 20, Nov. 13, 2000, pp. 3263-3265.

* cited by examiner

METHOD OF FORMING A LOW VOLTAGE DRIVE FERROELECTRIC CAPACITOR

FIELD OF THE INVENTION

The present invention relates to integrated circuits and more particularly to integrated circuits including ferroelectric capacitors and method of manufacturing the same.

BACKGROUND OF THE INVENTION

Ferroelectric materials such as lead zirconate titanate (PZT) are utilized in forming ferroelectric capacitors. These capacitors are then used in the formation of ferroelectric RAM (FRAM) devices due to the capacitors' electrical properties of retention, read/write endurance, and speed of the write cycle.

As memory integrated circuits become more dense, low voltage operation becomes increasingly more important. Traditional methods of improving the polarization switching property of ferroelectric materials, such PZT, focus on changing the composition of the PZT by adding soft dopants such as Vanadium, Lead or other dopants. Lanthanum (La) doping has also been proposed as described in B. Yang, et al., "Low Voltage Performance of Pb(Zr,Ti)O$_3$ Capacitors Through Donor Doping," Applied Physics Letters, Vol. 71(24), Dec. 15, 1997. However, this approach has only pushed the driving voltage of the polarization switching down to between 1.5 to 2.0 volts. This, in turn, restricts the required voltage drive of FRAM devices to that range.

More recently, it was reported in N. Duan et al., "Enhancement of Dielectric and Ferroelectric Properties by Addition of Pt Particles to a Lead Zirconate Titanate Matrix," Applied Physics Letters, Vol. 77(20), Nov. 13, 2000, that large amounts of platinum particles in a PZT matrix can result in improvements in the dielectric and ferroelectric properties of a PZT composite. A powder PZT/Pt composite was prepared by conventional solid state reaction by sintering of mixed powders, and dense compacts were formed from the composite for testing. The PZT/Pt composite material proposed by the article, however, is not a thin film. A thin film generally has a thickness that ranges from 1.0 nanometer to 1 micron. (K. N. Tu, et al., *Electronic Thin Film Science: For Electronical Engineers and Materials Sciences*, p. 1 (Macmillan Publishing Co. 1992). Rather, the PZT/Pt composite is a bulk material that contains micron-sized or larger particles of platinum in the PZT matrix. The bulk material is not suitable for forming ferroelectric capacitors in integrated circuits or FRAM devices. In ULSI technology, a ferroelectric film thicker than 1 μm (10,000 Å) in an integrated circuit has several disadvantages, including: (1) high cost; (2) difficult integration when a device is scaled down; and (3) difficulty in achieving low voltage applications.

Therefore, there remains a need for an improved ferroelectric capacitor, particularly a thin film ferroelectric capacitor, with improved polarization switching characteristics under low voltage drive and a method of manufacturing the same.

SUMMARY OF THE INVENTION

A method of forming a low-voltage drive thin film ferroelectric capacitor includes the steps of depositing a ferroelectric and platinum thin film dielectric layer over a bottom electrode, annealing the dielectric layer, wherein a nanocomposite layer is formed including nanoparticles of platinum and forming a top electrode over the dielectric layer. An integrated circuit is also provided including a ferroelectric capacitor. The capacitor includes a bottom electrode formed over a substrate and a ferroelectric and platinum thin film nanocomposite dielectric layer formed over the bottom electrode, wherein the nanocomposite layer includes nanoparticles of platinum. A top electrode is formed over the dielectric layer.

Both the remnant polarization and dielectric constant of the thin film are significantly enhanced by the formation of platinum nanoparticles. A capacitor having low voltage drive of 1 volt or lower with high remnant polarization, such as at least 7 μC/cm$^2$, can be achieved while repressing fatigue degradation and exhibiting no significant coercive field strength or leakage current affects. Low voltage drive FRAM devices may be fabricated using the nanocomposite thin film ferroelectric capacitor structure and fabrication method.

The above and other features of the present invention will be better understood from the following detailed description of the preferred embodiments of the invention that is provided in connection with the accompanying drawings.

BRIEF DESCRIPTION OF THE DRAWINGS

The accompanying drawings illustrate preferred embodiments of the invention, as well as other information pertinent to the disclosure, in which.

DETAILED DESCRIPTION

An integrated circuit including an improved ferroelectric capacitor, such as an integrated circuit including a FRAM memory device including ferroelectric capacitors, is described herein along with a method of manufacturing the same. The thin film nanocomposite ferroelectric capacitor described hereafter includes nanoparticles of a metal such as platinum and exhibits improved polarization switching and fatigue degradation characteristics.

As used herein, a "nanocomposite" is a composite of a first material with nanoparticles of a second material. There is no significant chemical interaction between the first and second materials and the composition can be distinguished by using a simple physical analysis method such as Scanning Electron Microscopy (SEM) or Transmission Electron Microscopy (TEM). By "nanoparticle" it is meant a particle having dimension between about 10 to 900 Å.

Figure 1:
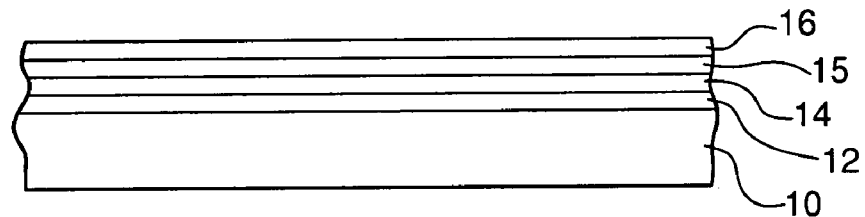
FIGS. 1–3 are cross-sectional views of a portion of a semiconductor substrate illustrating the formation of a ferroelectric capacitor.
Figure 2:
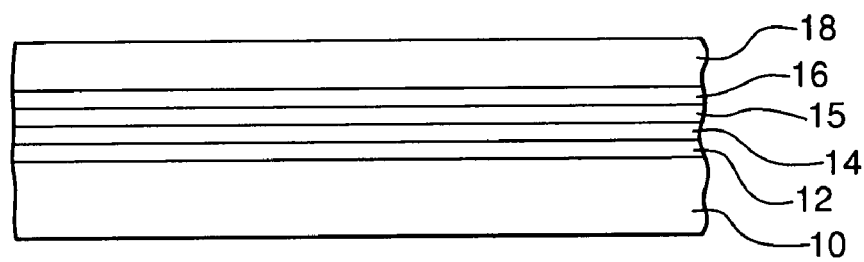
Figure 3:
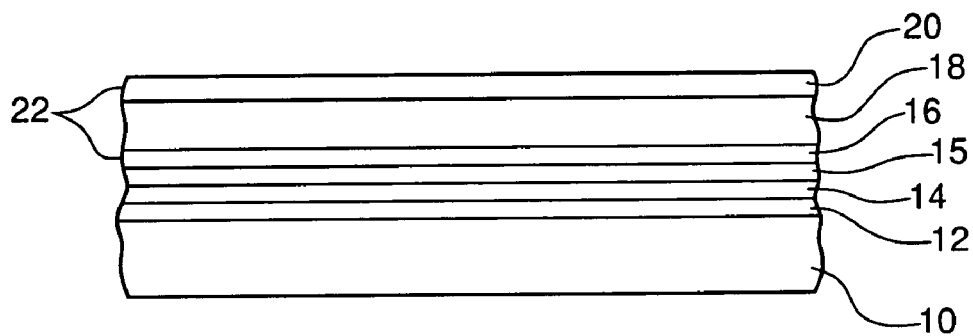

Referring first to FIGS. 1–3, the formation of an exemplary ferroelectric capacitor over a MOS transistor structure, preferably a CMOS structure, in the formation of a FRAM device is described. It should be apparent that FIGS. 1–3 illustrate the formation of only one memory cell in an array of memory cells forming the FRAM device.

As shown in FIG. 1, a wafer 10 is provided including a substrate having a partially-finished CMOS integrated circuit including CMOS addressing, selection, and control logic familiar to those in the art and commercially available. A thermal oxide layer 12 ($SiO_2$) is formed thereover to a thickness of approximately 150 nm. A layer of titanium 14 is then sputter deposited onto oxide layer 12. The titanium layer 14 may then be oxidized to form an adhesion layer of titanium oxide that enhances adhesion to a bottom electrode of a ferroelectric capacitor formed thereover.

Alternatively, the bottom electrode of the capacitor is then patterned and formed directly over the titanium layer 14. The bottom electrode may be formed from platinum or other conductive material such as tantalum, titanium, iridium, etc. In one exemplary embodiment, the bottom electrode includes a platinum layer 15 having a thickness of approximately 150 nm deposited over titanium layer 14. A Lanthanum Nickel Oxide ($LaNiO_3$ or "LNO") layer having a thickness of approximately 100 nm is then sputter deposited or otherwise formed over the platinum layer 15 It is believed that the use of $LaNiO_3$ layer in the bottom electrode of the capacitor helps to facilitate the crystallization of the deposited ferroelectric thin film (described below) at lower temperatures and to repress the fatigue problem associated with PZT films, i.e., decay in the switching polarization after numerous switching cycles. Lower growth temperatures, in turn, conserve thermal budget and avoid the overgrowth of platinum clusters. If the clusters become larger than nanoparticles, the electrical properties of the thin film may be affected.

Referring to FIG. 2 a thin film ferroelectric and platinum dielectric layer 18 is patterned and formed over the bottom electrode. In one exemplary embodiment, the ferroelectric material is lead zirconate titanate (PZT) and platinum is the minority, preferably (but not necessarily) less than 10%, and more preferably in the range of 2.5–8.5%. Applicants have found that the concentration of nanoparticles is strongly dependent on deposition methods, the size of the nanoparticles and the materials of the ferroelectric/nanoparticle composite. It should be understood, therefore, that the content of the nanoparticles is not limited to the ranges provided herein. The dielectric layer 18 preferably has a thickness that is as thin as possible with available deposition techniques, and at least less than a micron. Using currently available deposition techniques, the dielectric layer 18 preferably has a thickness between about 500 and 2000 Å. In one exemplary embodiment, the dielectric layer 18 has a thickness of about 1500 Å. As deposition techniques continued to improve, it is anticipated that the dielectric layer 18 may have a thickness of less than 500 Å, and even between about 10 and 200 Å.

The PZT-Pt dielectric layer 18 should be deposited such that the platinum is relatively uniformly distributed through the PZT material. In an exemplary embodiment, the layer 18 is deposited by sputtering (such as PVD sputtering, magnetron sputtering, e-beam sputtering, etc.), preferably by a co-sputtering process. The layer 18 may also be deposited using chemical vapor deposition (CVD), including plasma enhanced CVD (PECVD) or low pressure CVD (LVCVD), laser ablation or sol-gel process.

After the layer 18 is deposited, a rapid thermal anneal process is employed to crystallize the film 18 wherein nanoparticles of platinum are fixed in the PZT matrix. The annealing temperature depends upon the ambient type and annealing method. For example, a conventional furnace anneal may be used at a temperature between about 250–750° C., and preferably around 550° C., for a period of 3–10 minutes or longer, depending upon the temperature, and preferably in an oxidization ambience. A rapid thermal anneal between about 30–90 seconds at about 450–850° C. may also be employed. Still further, a pulsed laser anneal for a short time period, e.g., less than 30 seconds, at a relatively high temperature, e.g., greater than 700° C., may also prove effective for nanocomposite formation. In some cases, an inert gas may be used to dilute the ambient during oxidation while hydrogen gas may be used to control nanoparticle size. The appropriate pressure range is dependent on what oxidant and equipment are selected. It is anticipated that the total pressure may range from a few mTorr to 1.0 atm. The nanoparticle size is primarily controlled by process temperature and process time. The preferred target size is around 30 nm or less, but a range from approximately 10–70 nm should also provide reasonable polarization values in the nanocomposite ferroelectric film. The density of the metal nanoparticle in the nanocomposite dielectric material is less than $5.0 \times 10^{13}$ per $cm^2$. An in-situ stress sensor may be used to provide confident metrology for ensuring the size of the nanoparticles during nanoparticle formation, since film stress of the desired nanoparticle film is different from a non-formed or over-formed film.

As shown in FIG. 3, a top electrode 20 is then patterned and formed on the dielectric layer 18 to form a ferroelectric capacitor structure 22. An exemplary top electrode may be formed from platinum or $LaNiO_3$ (LNO). Alternatively, a Pt/LNO top electrode may be formed. A platinum electrode 20 preferably has a thickness in the range of 50–200 nm, whereas a $LaNiO_3$ top electrode preferably has a thickness in the range of 40–150 nm.

Therefore, an exemplary capacitor structure 22 may include, from top electrode to bottom electrode the following structures: Pt/PZT-Pt/LNO/Pt or Pt/LNO/PZT-Pt/LNO/Pt, with the latter structure exhibiting better leakage current characteristics as described below. After the top electrode 20 is formed, conventional process steps may be employed to complete the FRAM device, including forming and patterning metalization layers so that the memory cells can be accessed and passivating the structure.

Figure 4:
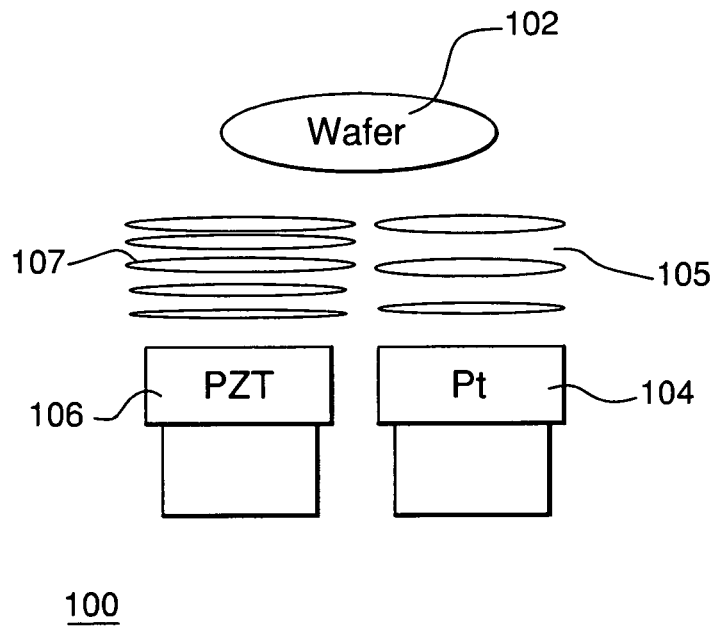
FIG. 4 is an illustration of a PZT and Pt co-sputtering system.

A nanocomposite ferroelectric thin film of PZT-Pt where PZT was the majority and Pt the minority was formed on a $LaNiO_3$ electrode in a co-sputtering system 100 diagrammatically illustrated in FIG. 4. The co-sputtering system 100 includes a platinum target 104 and a PZT target 106. Platinum 105 and PZT 107 were sputtered onto the $LaNiO_3$ electrode formed over a 150 nm platinum layer on wafer 102. The wafer 102 was rotated at a high speed to promote deposition uniformity. The rotation speed of the substrate was approximately, but should not be limited to, 40 cycles/min during deposition. The $Ar/O_2$ gas ratios were around 75/25, 90/10, and 100/0 for the LNO, PZT and Pt depositions, respectively. The products of target-substrate distance (in millimeters) and pressure (in mTorr) were 200 mm·mTorr, 600 mm·mTorr, and 200 mm·mTorr, respectively. A rapid thermal annealing was then performed on the wafer at a temperature of 550° C. in an oxygen ambience for 180 seconds to crystallize the deposited thin film. The PZT-Pt thin film was deposited to a thickness of approximately 900 Å (90 nm).

Figure 5:
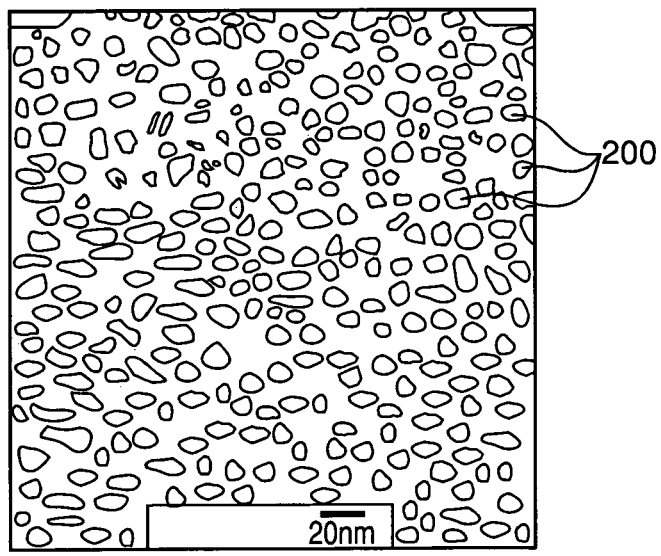
FIG. 5 is a TEM picture of a thin film PZT-Pt nanocomposite structure formed according to an exemplary fabrication method described herein.

As shown in FIG. 5, a nanocomposite structure was clearly observed via the TEM picture of the crystallized PZT-Pt film. Platinum nanoparticles, a few of which are indicated by reference numerals 200, were clearly observed. As shown by the 20 nm scale on the TEM, most, if not all, platinum clusters appear to have dimensions that are at least less than 20 nm, and more likely less than approximately 10 nm. A platinum top electrode was then formed over the co-sputtered and annealed dielectric layer.

The above-described process was used to form a thin film Pt/PZT-Pt/LNO/Pt nanocomposite ferroelectric capacitor having 3.4% Pt, a thin film Pt/PZT-Pt/LNO/Pt nanocomposite ferroelectric capacitor having 3.4% Pt, and a thin film Pt/LNO/PZT-Pt/LNO/Pt nanocomposite ferroelectric capacitor having 4.0% Pt. These capacitors were tested as described below and compared against a pure thin film PZT ferroelectric capacitor.

The P-E (remnant polarization (Pr) versus electric field) of the fabricated Pt/PZT-Pt/LaNiO$_3$/Pt capacitors was measured to show the polarization change of the ferroelectric material with an applied electric field. These measurements were made with an RT66A Standardized Ferroelectric Test System available from Radiant Technologies, Inc. with a virtual ground mode. For purposes of clarity, a brief discussion of remnant polarization is provided. The direction of the electric dipole of a ferroelectric material can be changed by applying an electric field. The polarization remains when the electric field is removed. This polarization is referred to as the "remnant polarization." To eliminate the remnant polarization, an external opposite electric field (coercive field strength, Ec) is required. For practical use, the Ec of the ferroelectric material should be smaller than its breakdown field. Like ferromagnetic materials, a displacement-electric field (D-E) hysteresis loop exists. The minimum driving voltage is the minimum applied voltage required to make the ferroelectric domains align in the same direction and a remnant voltage should be observed. The remnant polarization allows the capacitor to store "1" and "0" states, with the positive polarization representing a "0" state and the negative polarization representing a "1" state.

Figure 6B:
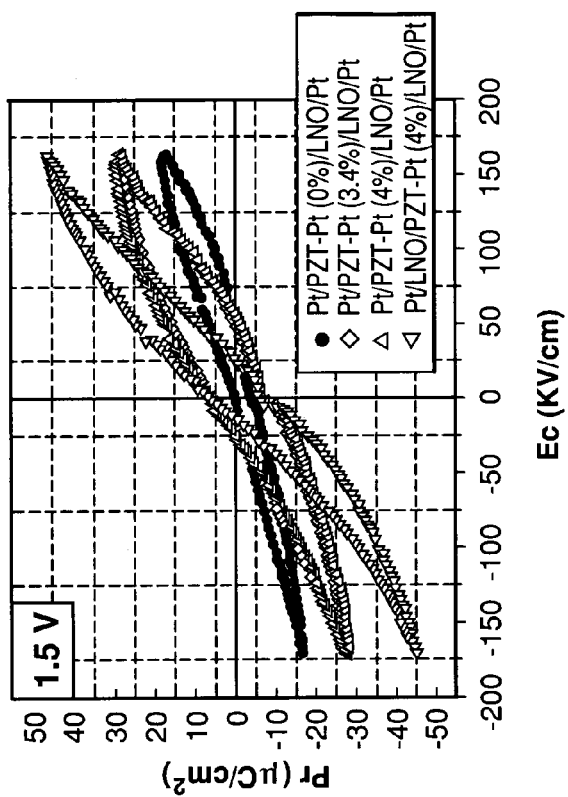
FIG. 6 shows P-E curves for three fabricated thin film PZT-Pt nanocomposite ferroelectric capacitors and a pure PZT ferroelectric capacitor.
Figure 6A:
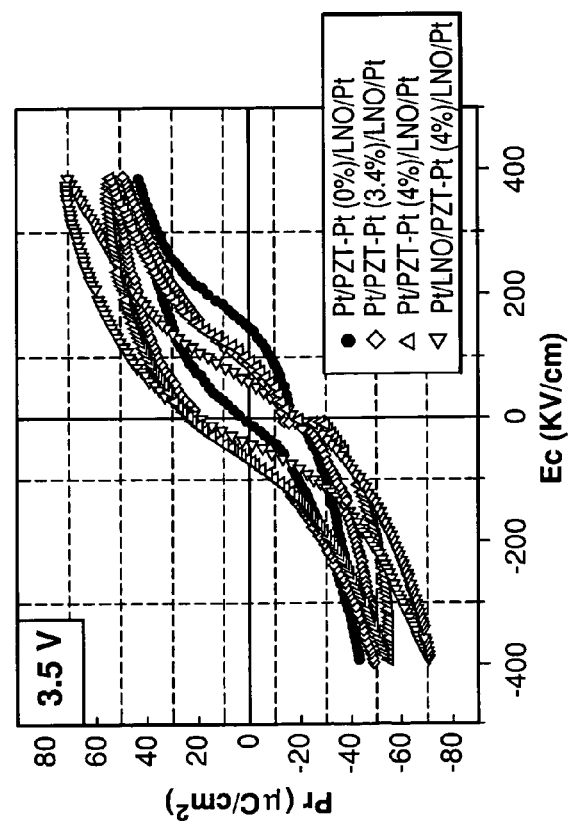
Figure 6C:
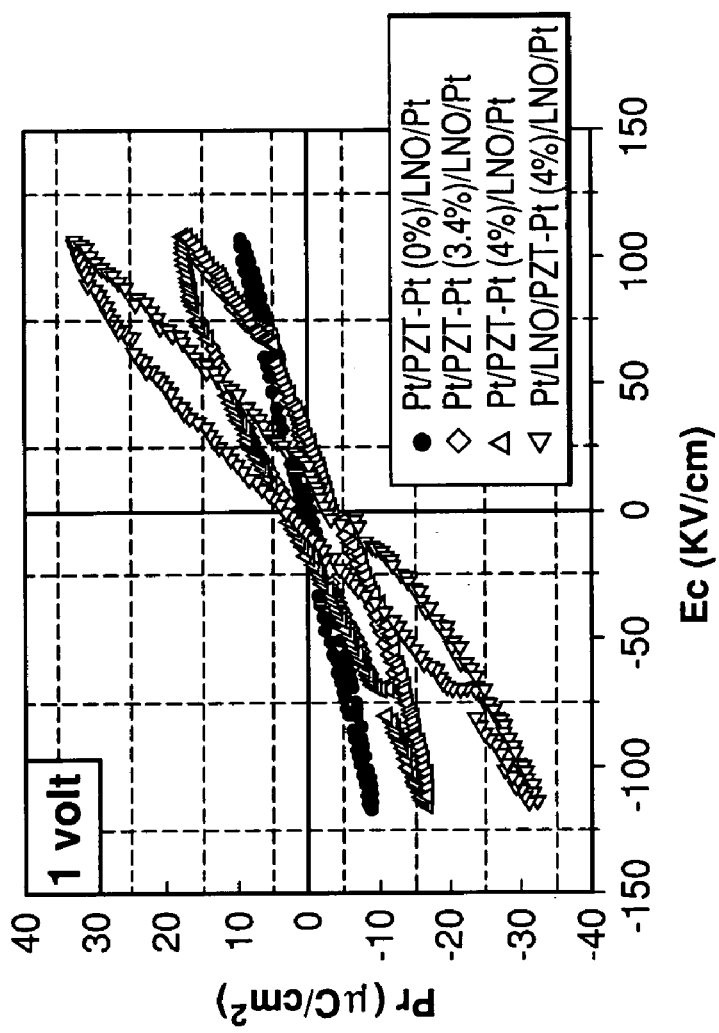
Figure 7:
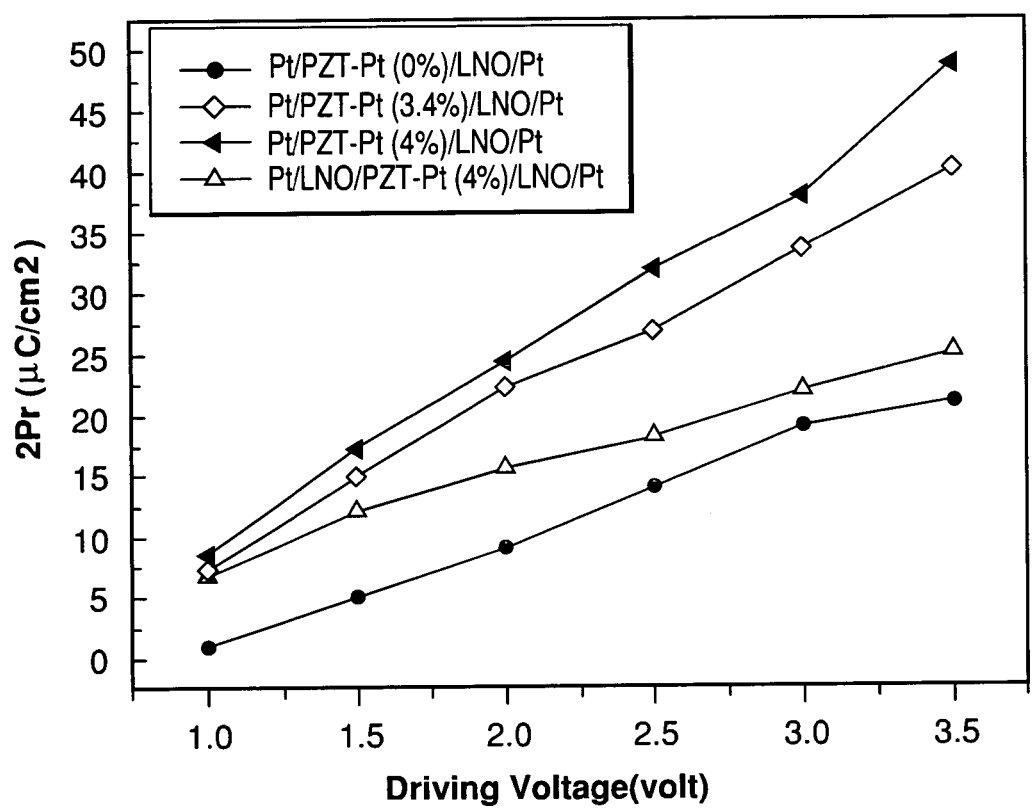
FIG. 7 is a plot of the 2PR value verses driving voltage of the fabricated capacitors.

The P-E curves of the fabricated capacitors (the pure PZT capacitor and the 3.4% and 4.0% platinum PZT-Pt thin film nanocomposite capacitors) are shown in FIG. 6. Polarization in micro-coulombs per square centimeter ($\mu C/cm^2$) is plotted against the driving voltage in kilovolts per centimeter (kV/cm) for driving voltages between approximately ±3.5 volts (FIG. 6A), ±1.5 volts (FIG. 6B) and ±1.0 volts (FIG. 6C). Note that the curves are not perfectly smooth because the P-E curves were measured in one cycle of AC voltage, and the break in the curve corresponds to the relaxation of the polarization. The remnant polarization values can be extracted from the hysteresis curves of FIG. 6 at 0 volts on the X-axis, as well as the 2Pr plot for a fabricated Pt/LNO/PZT-Pt (4%)/LNO/Pt capacitor. The slopes of FIG. 6 also indicate that the dielectric constant of the PZT/Pt nanocomposite is different from pure PZT. The dielectric constant of the PZT/Pt film varies with Pt content. FIG. 7 is a graph of "2Pr" values verses driving voltage for the above described capacitors as plotted from the data of the P-E curves of FIG. 6.

The capacitors made with the thin film PZT-Pt nanocomposites indicate higher remnant polarization (Pr) than the pure PZT capacitor for conventional driving voltages of 1.5–3 volts. It is also apparent from the figures that the switching performance (i.e., representing a switch from a "0" to a "1" state and vise versa) of the nanocomposite thin film PZT-Pt capacitors under low voltage drive (e.g., 1 volt or less) is much better than the low voltage drive performance of the pure PZT capacitor. This is particularly evident from the 2PR verses driving voltage plot of FIG. 7, which indicates that the 2PR value—the difference between the remnant polarization values on the hysteresis loop at 0 volts—of the PZT-Pt nanocomposite capacitors is still larger than approximately 7 $\mu C/cm^2$ at 1 volt, at which point the pure PZT is almost unpolarized. Superior performance is also shown for more conventional driving voltage ranges above 1.5 volts.

Figure 8:
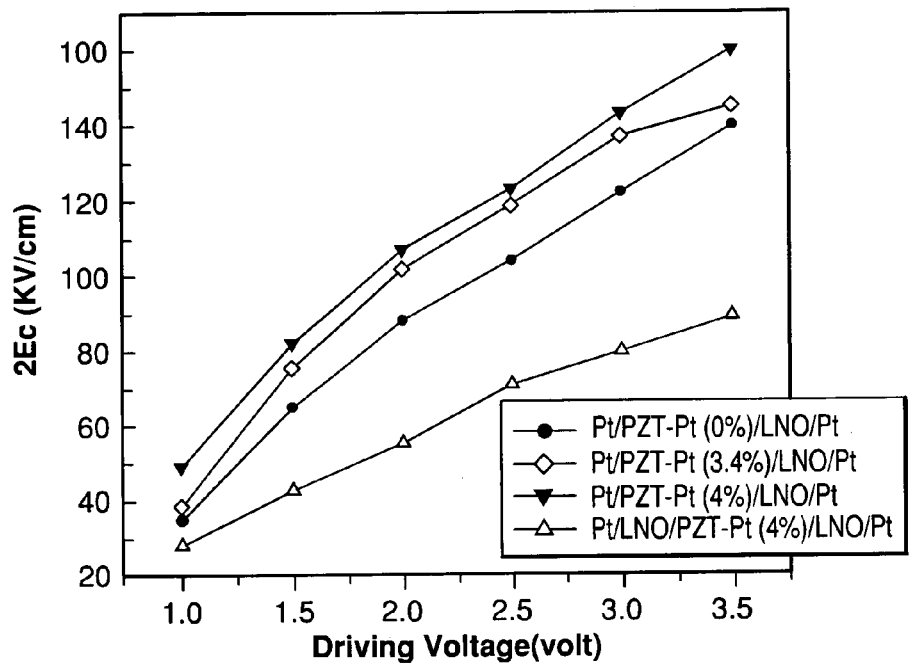
FIG. 8 is a plot of the coercive field verses driving voltage of the fabricated capacitors.
Figure 9:
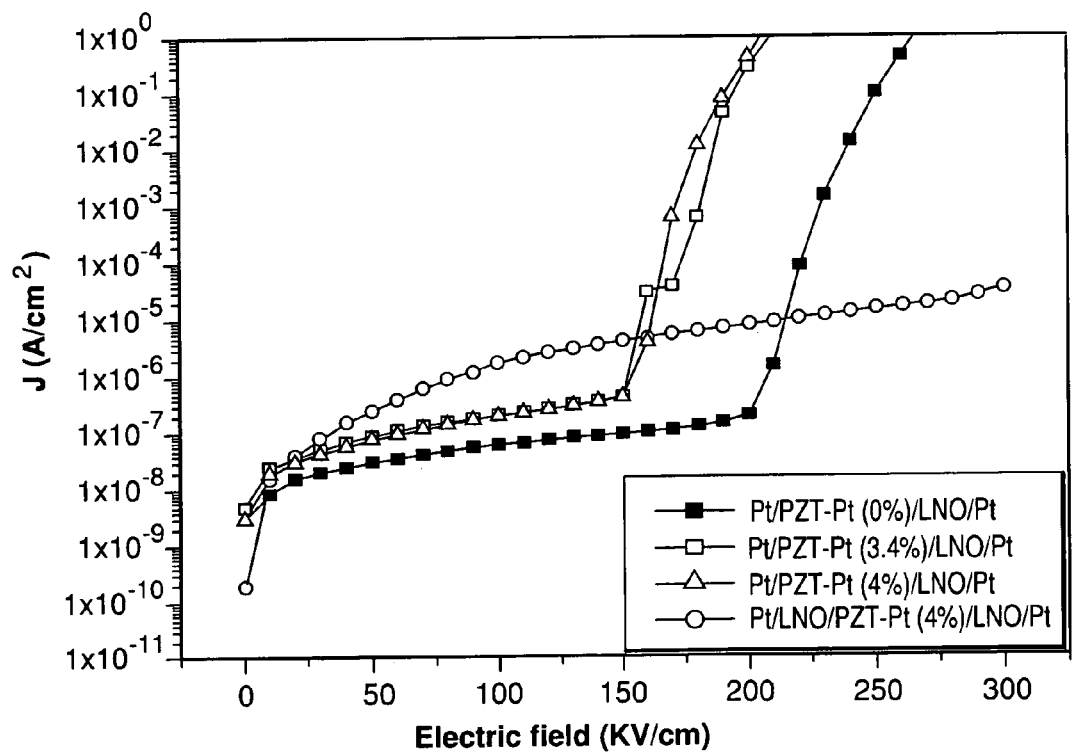
FIG. 9 is a plot of the leakage current characteristics of the fabricated capacitors.

FIGS. 8 and 9 are plots of the coercive field (2Ec) and leakage current verses driving voltage, respectively, of the fabricated nanocomposite thin film capacitors and pure PZT thin film capacitor. The leakage current characteristics were measured using an HP 4140B DC voltage source with an applied voltage range between approximately 0–5 volts, a step of 0.1 volt, a hold time of 10 seconds and a delay time of 10 seconds. The coercive field value can be determined from the data plotted in FIG. 6 as the voltage values in the hysteresis loop when the polarization is zero. FIGS. 8 and 9 illustrate that the coercive field and leakage current characteristics are not significantly affected when comparing the nanocomposite structures with the pure PZT structure. These curves indicate that the leakage of the PZT-Pt nanocomposite film is less than one order. The Pt/LNO/PZT-Pt/LNO/Pt structure exhibits excellent stability for low leakage current up to at least an applied electric field of 300 kV/cm.

Per the above, a nanocomposite thin film ferroelectric capacitor is provided and a method of manufacturing the same. A ferroelectric capacitor having low voltage drive of 1 volt or lower with high remnant polarization of at least 7 $\mu C/cm^2$ can be achieved while repressing fatigue degradation and exhibiting no significant coercive field strength or leakage current affects. Low voltage drive FRAM devices may be fabricated using the nanocomposite thin film ferroelectric capacitor structure.

Figure 10:
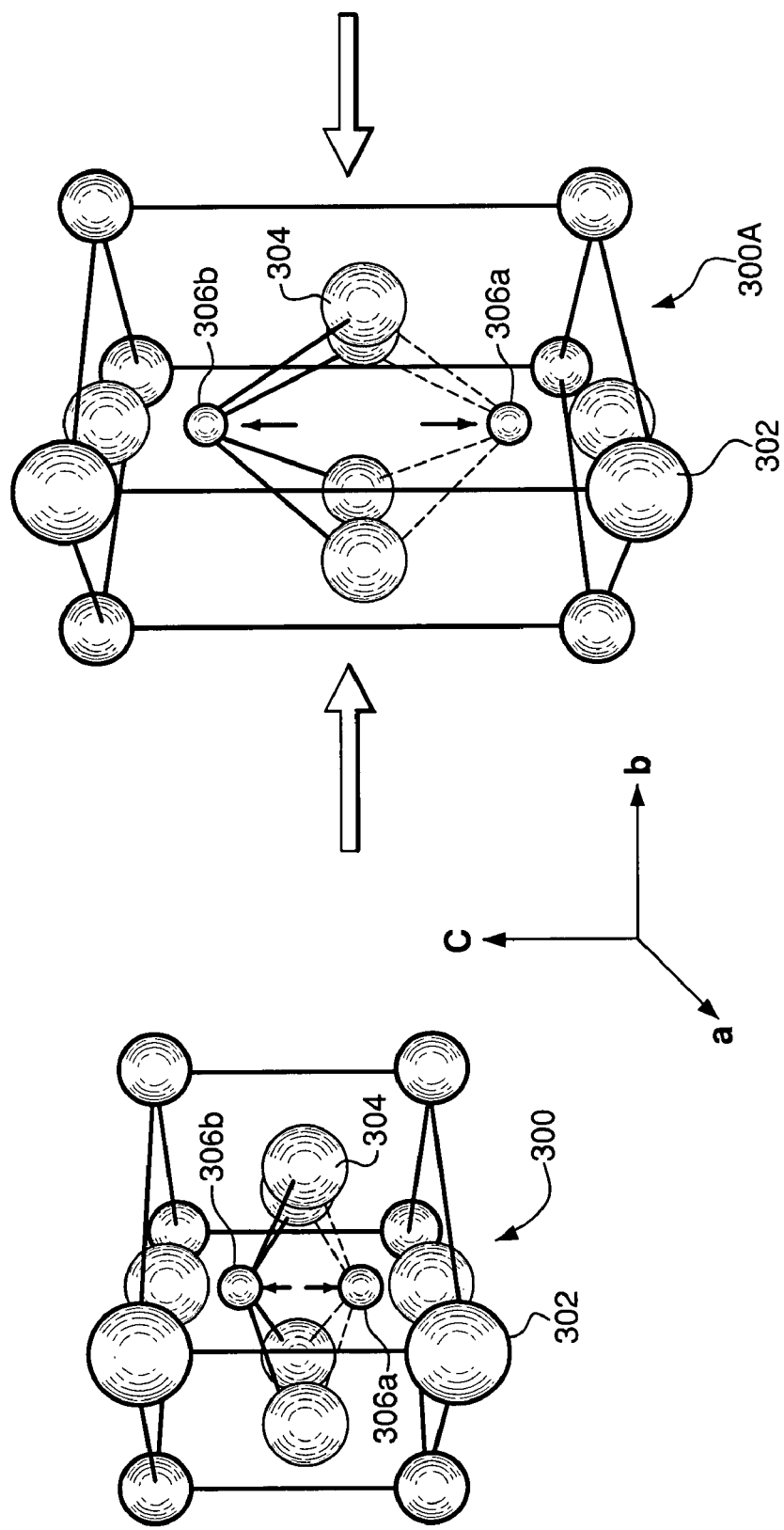
FIG. 10 illustrates the an uncompressed and compressed PZT lattice structures.

It is also believed that the above-described nanocomposite structure may enhance the piezoelectric and pyroelectric properties of the ferroelectric thin film. In addition to the use of the above-described nanocomposite thin film in forming ferroelectric capacitors and FRAM devices, it is believed that the nanocomposite thin film may be useful for membrane switches in piezoelectric electro-micromechanical systems and for uncooled infrared detectors and thermal sensors Still further, it is believed that the Pt nanoparticles clusters induce lattice coherent compression in the thin film after thermal treatment, i.e., the increasing of lattice c/a (lattice constant ratio of c-axis to a-axis) of PZT or even SBT (Strontium Bismult Tanatalate). This phenomena was discovered by applicants using X-ray diffraction. This phenomena is illustrated in FIG. 10. Reference 300 identifies the lattice structure of a pure PZT material. Reference 302 identifies lead atoms and reference 304 identifies oxygen atoms. Reference 306a identifies Zr/Ti in the "1" state and Zr/Ti in the "0" state. Reference 300A identifies the lattice structure of the PZT material in a PZT-Pt nanocomposite structure. As is depicted by lattice structure 300A, the lattice constant ration of the c-axis to the a-axis increases. It is believed that this phenomena may improve the remnant polarization, leakage characteristics, fatigue degradation and/or other characteristics the PZT material. It is also contemplated that other nanoparticles (besides Pt) such as Ag, Au, Mo, Ni, La, V, etc., deposited in minority percentages, preferably (but not necessarily) less than 10%, and more preferably in the range of 2.5–8.5%, could also provide the same results. Still further, some alloy nanoparticles, such as Al—Mn, and insulating nanoparticles, such $C_{60}$, may also achieve the same results.

Although the invention has been described in terms of exemplary embodiments, it is not limited thereto. Rather, the appended claims should be construed broadly to include other variants and embodiments of the invention that may be made by those skilled in the art without departing from the scope and range of equivalents of the invention.

What is claimed is:

1. A method of forming a low-voltage drive thin film ferroelectric capacitor, comprising the steps of:
   depositing a thin film dielectric layer over a bottom electrode, said thin film dielectric layer comprising a ferroelectric material with platinum dispersed therein;
   annealing said dielectric layer, wherein a nanocomposite layer is formed including nanoparticles of platinum; and
   forming a top electrode over said dielectric layer.

2. The method of claim 1, wherein at least said bottom electrode includes a $LaNiO_3$ layer.

3. The method of claim 1, wherein said dielectric layer comprises a PZT-platinum thin film.

4. The method of claim 3, wherein said PZT-platinum thin film is less than approximately 10% platinum.

5. The method of claim 3, wherein said PZT-platinuni thin film is deposited to a thickness of less than approximately 2000 Å.

6. The method of claim 3, wherein said annealing step is for approximately 3 to 10 minutes in an oxidization ambient at a temperature between approximately 250–750° C.

7. The method of claim 3, wherein said depositing step includes the step of sputter depositing said PZT-Pt thin film.

8. The method of claim 7, wherein said PZT-platinum thin film is formed by co-sputtering using a PZT target and a platinum target.

9. The method of claim 3, wherein said depositing step includes the step of forming said PZT-platinum thin film by chemical vapor deposition.

10. The method of claim 1, wherein substantially all of said platinum nanoparticles have dimensions less than about 30 nm.

11. The method of claim 1, wherein said dielectric layer comprises a PZT-platinum thin film and said thin film is between about 2.5–8.5% platinum.

12. The method of claim 1, wherein said annealing step comprises a rapid thermal anneal.

13. The method of claim 1, wherein said annealing process comprises a pulsed laser annealing.

14. The method of claim 13, wherein said pulsed laser annealing is for less than or about 30 seconds at a temperature of greater than or about 700° C.

15. A method of forming a low-voltage drive thin film ferroelectric capacitor, comprising the steps of:
   forming a bottom electrode having a $LaNiO_3$ layer over a substrate;
   depositing a dielectric layer including a PZT-Pt thin film over said bottom electrode;
   performing a rapid thermal anneal on said substrate, wherein a PZT-Pt nanocomposite layer is formed including nanoparticles of platinum fixed in a PZT matrix; and
   forming a top electrode over said dielectric layer.

16. The method of claim 15, wherein PZT-Pt thin film is less than approximately 10% platinum.

17. The method of claim 15, wherein said annealing step is approximately 180 seconds or less in an oxidation ambient at a temperature between about 450–850° C.

18. The method of claim 15, wherein said PZT-Pt thin film is formed by co-sputtering process using a PZT target and a platinum target.

19. The method of claim 15, wherein substantially all of said platinum nanoparticles have dimensions less than about 30 nm.

20. A method of forming a low-voltage drive thin film ferroelectric capacitor, comprising the steps of:
   co-sputtering using at least a first and second targets a thin film dielectric layer over a bottom electrode, said thin film dielectric layer comprising a ferroelectric material and platinum;
   annealing said dielectric layer, wherein a nanocomposite layer is formed including nanoparticles of platinum fixed in said ferroelectric material; and
   forming a top electrode over said dielectric layer.

21. The method of claim 20, wherein at least said bottom electrode includes a $LaNiO_3$ layer.

22. The method of claim 20, wherein said ferroelectric material comprises PZT.

23. The method of claim 20, wherein said thin film dielectric layer comprises less than approximately 10% platinum.

24. The method of claim 20, wherein said thin film dielectric layer is deposited to a thickness of less than approximately 2000 Å.

25. The method of claim 20, wherein said thin film dielectric layer is deposited to a thickness of less than approximately 1500 Å.

26. The method of claim 20, wherein said annealing step is for approximately 3 to 10 minutes in an oxidization ambient at a temperature between approximately 250–750° C.

27. The method of claim 20, wherein substantially all of said platinum nanopartioles have dimensions less than about 70 nm.

28. The method of claim 20, wherein substantially all of said platinum nanoparticles have dimensions less than about 30 nm.

29. The method of claim 28, wherein said ferroelectric material comprises PZT and said thin film dielectric layer comprises between about 2.5–8.5% platinum.

30. A method of forming a low-voltage drive thin film ferroelectric capacitor, comprising the steps of:
   depositing via chemical vapor deposition a thin film dielectric layer over a bottom electrode, said thin film dielectric layer comprising a ferroelectric material and platinum;
   annealing said dielectric layer, wherein a nanocomposite layer is formed including nanoparticles of platinum fixed in said ferroelectric material; and
   forming a top electrode over said dielectric layer.

31. The method of claim 30, wherein at least said bottom electrode includes a $LaNiO_3$ layer.

32. The method of claim 30, wherein said ferroelectric material comprises PZT.

33. The method of claim 30, wherein said thin film dielectric layer comprises less than approximately 10% platinum.

34. The method of claim 30, wherein said thin film dielectric layer is deposited to a thickness of less than approximately 2000 Å.

35. The method of claim 30, wherein said thin film dielectric layer is deposited to a thickness of less than approximately 1500 Å.

36. The method of claim 30, wherein said annealing step is for approximately 3 to 10 minutes in an oxidization ambient at a temperature between approximately 250–750° C.

37. The method of claim 30, wherein substantially all of said platinum nanoparticles have dimensions less than about 70 nm.

38. The method of claim 30, wherein substantially all of said platinum nanoparticles have dimensions less than about 30 nm.

39. The method of claim 38, wherein said ferroelectric material comprises PZT and said thin film dielectric layer comprises between about 2.5–8.5% platinum.

40. A method of forming a low-voltage drive thin film ferroelectric capacitor, comprising the steps of:

forming a bottom electrode comprising a $LaNiO_3$ layer over a substrate;

depositing a dielectric layer including a PZT-Pt thin film over said bottom-electrode, said dielectric layer having a thickness of less than about 2000 Å, said PZT-Pt thin film comprising between about 2.5–8.5% Pt;

performing a rapid thermal anneal on said substrate, wherein a PZT-Pt nanocomposite layer is formed including nanoparticles of platinum fixed in a PZT matrix, wherein substantially all of said platinum nanoparticles have dimensions less than about 30 nm; and forming a top electrode over said dielectric layer.

41. The method of claim 40, wherein said rapid thermal anneal step is performed for between about 30–180 seconds at a temperature between about 450–850° C.

* * * * *

UNITED STATES PATENT AND TRADEMARK OFFICE
CERTIFICATE OF CORRECTION

| | | |
|---|---|---|
| PATENT NO. | : 7,071,007 B2 | Page 1 of 1 |
| APPLICATION NO. | : 10/313776 | |
| DATED | : July 4, 2006 | |
| INVENTOR(S) | : Yuan-Chieh Tseng, Chao-Hsiung Wang and Tai-Bor Wu | |

It is certified that error appears in the above-identified patent and that said Letters Patent is hereby corrected as shown below:

Column 7, line 27, delete "platinuni" and insert therefor --platinum--.

Signed and Sealed this

Twenty-second Day of May, 2007

JON W. DUDAS
*Director of the United States Patent and Trademark Office*